(12) United States Patent
Washburn et al.

(10) Patent No.: US 11,084,211 B1
(45) Date of Patent: Aug. 10, 2021

(54) ADDITIVE MANUFACTURING PRINT-HEADS FOR EXOTIC MATERIAL APPLICATIONS

(71) Applicant: National Technology & Engineering Solutions of Sandia, LLC, Albuquerque, NM (US)

(72) Inventors: Cody M. Washburn, Albuquerque, NM (US); Charles R. Martin, Sandia Park, NM (US); Jerry D. Strother, Edgewood, NM (US); John Cates, Albuquerque, NM (US); Michael Randolph Satches, Edgewood, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 510 days.

(21) Appl. No.: 16/109,234

(22) Filed: Aug. 22, 2018

(51) Int. Cl.
   *B29C 64/209* (2017.01)
   *H01L 41/333* (2013.01)
   (Continued)

(52) U.S. Cl.
   CPC .......... *B29C 64/209* (2017.08); *B29C 64/364* (2017.08); *B29C 71/0081* (2013.01); *H01L 41/333* (2013.01); *B29K 2027/16* (2013.01); *B33Y 10/00* (2014.12); *B33Y 30/00* (2014.12); *B33Y 70/00* (2014.12); *B33Y 80/00* (2014.12); *H01L 41/193* (2013.01)

(58) Field of Classification Search
   CPC . B29C 64/209; B29C 64/364; B29C 71/0081; H01L 41/314; H01L 41/257; H01L 41/29; H01L 41/333
   See application file for complete search history.

(56) References Cited

U.S. PATENT DOCUMENTS

2014/0333011 A1   11/2014   Javidan et al.
2016/0016369 A1   1/2016    Tarbutton et al.

OTHER PUBLICATIONS

Chang, et al., "Direct-Write Piezoelectric Polymeric Nanogenerator with High Energy Conversion Efficiency", Nano Letter 10.2, pp. 1-22 (2010).

(Continued)

*Primary Examiner* — Joseph S Del Sole
*Assistant Examiner* — John Robitaille
(74) *Attorney, Agent, or Firm* — Madelynne J. Farber; Mark A. Dodd

(57) ABSTRACT

Described herein is an additive manufacturing apparatus that is well-suited for constructing piezoelectric sensors. The additive manufacturing apparatus includes an extrusion nozzle formed of a conductive material such as aluminum. The extrusion nozzle has a channel by way of which printing material exits the extrusion nozzle, wherein a build plate is configured to receive the printing material responsive to the printing material exiting the extrusion nozzle. An arc suppressor formed of a semiconductor is coupled to the extrusion nozzle and is configured to dissipate excess charge that would otherwise exist on the extrusion nozzle when a relatively high bias voltage is applied to the extrusion nozzle. Thus, the arc suppressor mitigates arcing between the extrusion nozzle and the build plate. Arc suppressing gas is also optionally introduced into a printing region, thereby further mitigating arcing between the extrusion nozzle and the build plate.

13 Claims, 5 Drawing Sheets

(51) Int. Cl.
*B29C 64/364* (2017.01)
*B29C 71/00* (2006.01)
*B33Y 80/00* (2015.01)
*H01L 41/193* (2006.01)
*B33Y 10/00* (2015.01)
*B33Y 30/00* (2015.01)
*B33Y 70/00* (2020.01)
*B29K 27/00* (2006.01)

(56) References Cited

OTHER PUBLICATIONS

Lee, et al., "Electric Poling-Assisted Additive Manufacturing Process for PVDF Polymer-based Piezoelectric Device Applications", Smart Material Struct. 23, pp. 1-7 (2014).

Lee, et al., "Preliminary Study of Corona-Assisted Additive Manufacturing Process of Piezoelectric Thermopolymer", Proceedings—ASPE 2015 Spring Topical Meeting: Achieving Precision Tolerances in Additive Manufacturing, pp. 1-4 (2015).

Lee, et al., "Electric Poling-Assisted Additive Manufacturing Process for Lead-Free Piezoelectric Device Fabrication", Procedia Manufacturing, vol. 1, 43rd Proceedings of the North American Manufacturing Research Institution of SME, pp. 320-326 (2015).

ADDITIVE MANUFACTURING PRINT-HEADS FOR EXOTIC MATERIAL APPLICATIONS

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Additive manufacturing is a category of manufacturing techniques that produce three-dimensional objects layer-by-layer. Each layer is generally thin, such as between 10 to 100 μm. Additive manufacturing is a useful technology because it offers design flexibility not available to traditional machining approaches and is empowered by software that can contribute to unique properties of additively manufactured parts. For example, the composition and geometry of each layer can be stored in a computer file. An additive manufacturing apparatus can deposit materials in accordance with each layer stored in the computer file so as to form the three-dimensional object. Objects produced via additive manufacturing often produce less waste material and can be manufactured using less energy than traditional manufacturing techniques.

Commercial off-the-shelf Fused Deposition Modeling (FDM) additive manufacturing systems utilize filament feed stock fed to a "print-head," wherein the filament is melted then deposited in layers to build up additively manufactured parts. Recent adaptations in FDM additive manufacturing techniques have opened the doors to novel electrically oriented, magnetically oriented, and chemically (i.e., endothermic/exothermic) oriented materials being used in additive manufacturing.

An example of an electrically oriented application of additive manufacturing involves making piezoelectric objects from polyvinylidene fluoride (PVDF). Specifically, print-heads of additive manufacturing machines have been modified to bias PVDF under extrusion using an electric field. The PVDF is extruded through the print-head under the electric field, resulting in inducement of piezoelectric properties in the extruded material (e.g., when making 50 to 200-micron thick sheets of piezo-electric material). However, in such an application, the PVDF is subject to being burned. Burning of the PVDF happens due to an electric arc forming between the print-head and the PVDF, wherein the electric arc is formed due to a high electric field (required in making the PVDF piezo-electric) in proximity to the PVDF. In a similar application, when using commercial off-the-shelf FDM additive manufacturing machines for magnetically oriented applications, the ability to manipulate and magnetically pole a filament feed under extrusion is not yet practicable.

In chemically oriented applications, premature or unwanted exothermic/endothermic reactions of metals and premature or unwanted reaction kinetics in polymers happen when using conventional additive manufacturing technologies. For example, if one would like to additively manufacture an object from magnesium, it would prove difficult as magnesium reacts (i.e., burns) when exposed to oxygen molecules found in air.

SUMMARY

The following is a brief summary of subject matter that is described in greater detail herein. This summary is not intended to be limiting as to the scope of the claims.

Described herein are various technologies pertaining to modifying an additive manufacturing apparatus for use with exotic materials (such as polyvinylidene fluoride (PVDF)). More specifically, described herein is a print-head apparatus that is well-suited for use in an additive manufacturing apparatus, wherein the print-head apparatus is well-suited for forming piezo-electric materials. For example, when constructing piezo-electric materials from PVDF using conventional additive manufacturing technologies, PVDF is extruded under a relatively high electric field (e.g., 3.0 MV/m), which is near the breakdown of air, and as such, the PVDF is subject to being burned. The print-head apparatus described herein comprises an arc suppressor formed of a semiconductor that is configured to mitigate burning of the PVDF.

When additively manufacturing a material intended to be electrically biased, an electric field is applied across a print-head of the additive manufacturing apparatus in reference to a build plate (i.e., a printing surface). However, if the electric field is sufficiently high, an electric arc can form from the print-head to the build plate, consequently causing burning of the material that is to be electrically biased. To mitigate the burning, the print-head apparatus described herein comprises an arc suppressor formed of a semiconductor (e.g., silicon), which acts to suppress arcing. For electrostatic discharge mitigation, a material that is semiconductive allows for a slow "bleed-off" of excess charge. For example, silicon that is p-doped acts as a very poor insulator and a very poor conductor; these qualities mitigate excess charge while still allowing an applied electric-field to sufficiently bias printing material. In an example, doping levels of greater than $10^{13}/cm^3$ can be used. Additionally, silicon can heat-up and cool-down quickly, has a low bond strength with most polymers, and can easily be cleaned due to the low bonding strength.

In addition to the arc suppressor being formed of a semiconductor, technologies for providing an inert gas to the print area are described herein, wherein the inert gas can further contribute towards arc-suppression by changing the break-down characteristics of the print area. Furthermore, many of the same inert gasses (and other gasses) can be used to suppress exothermic/endothermic reactions of metals and/or kinetics in polymers used in, but not limited to, chemically oriented materials being additively manufactured by preventing air from reaching a critical material (e.g., magnesium, sodium, lithium, potassium, composite polymer materials, etc.). In a similar example, reactive gas (e.g., NO, $SF_4$, $SO_2$, $H_2N_2$, $SO_2$, $CH_2H_2$, etc.) vapors can also be used along with additive manufacturing polymer films to intentionally swell or generate reactive sites for other chemical layers to be built from a base polymer film.

In another exemplary embodiment, an additive manufacturing apparatus that comprises a print-head that includes magnetic material (e.g., SmCo, NeFeB, etc.) and/or an electro-magnet is described herein. The print-head may be used in conjunction with a build plate (e.g., a printing surface) comprising a magnetic material and/or an electro-magnet. This combination allows for the additive manufacturing apparatus to manipulate and magnetically pole hard/soft ferrite-based nanomaterials in printing materials used to form piezoelectric sensors, for example.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
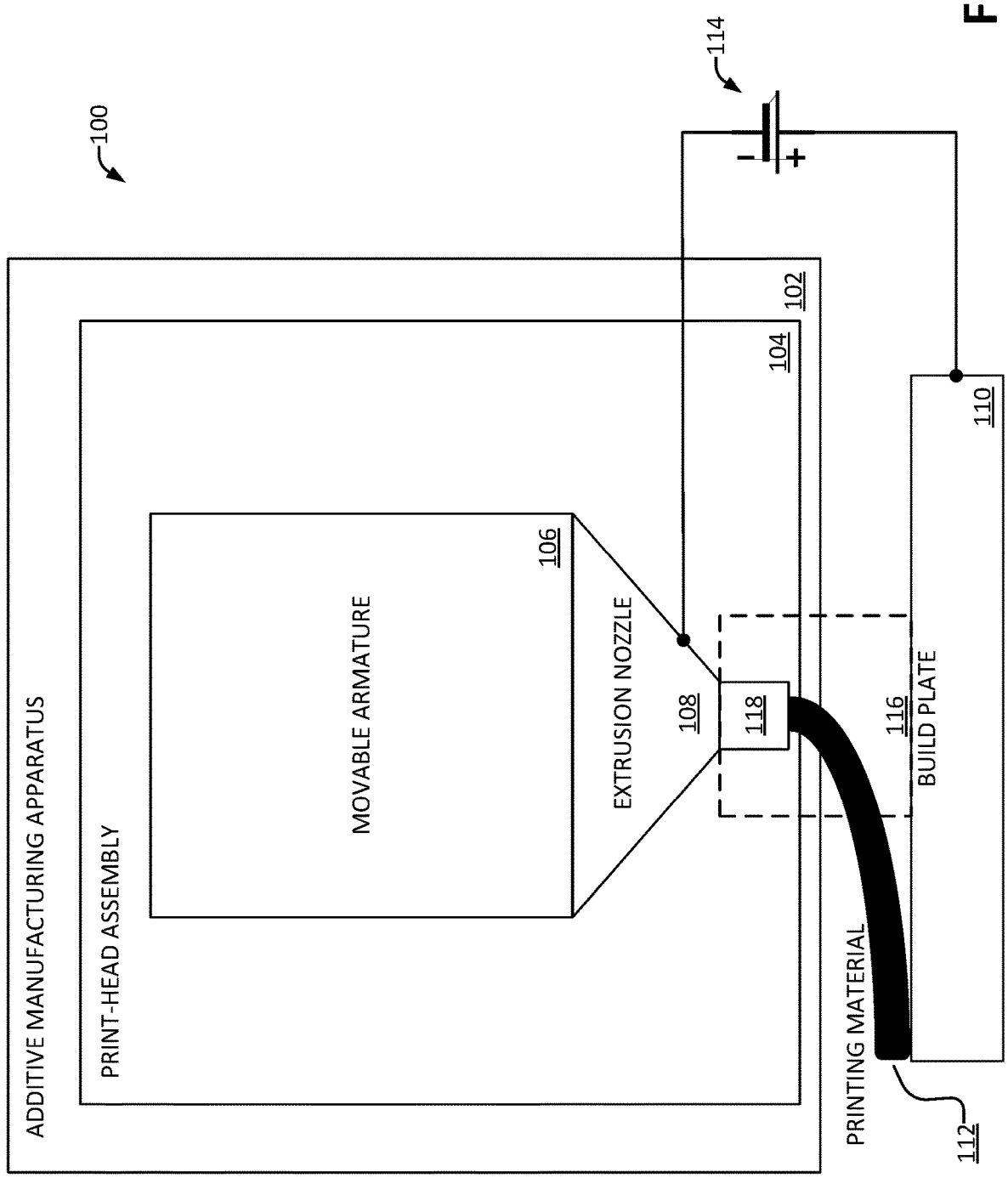
FIG. 1 is a schematic of an exemplary additive manufacturing system.

Various technologies pertaining to additively manufacturing exotic materials are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something and is not intended to indicate a preference.

Additive manufacturing is a category of manufacturing techniques that produce three-dimensional objects layer-by-layer. Herein, many examples and descriptions will refer to a single pass of a print-head, or a single layer, however, it is noted that multiple passes of the print-head and multiple deposited layers may be involved. To illustrate, a build plate is present, wherein a first layer is deposited onto the build plate, a second layer is deposited onto the first layer, etc.

With reference to FIG. 1, an exemplary system 100 that facilitates additively manufacturing an exotic material is depicted. In a more specific example, the exemplary system 100 is well-suited for manufacture of piezoelectric sensors, wherein such sensors are manufactured by way of additive manufacturing technologies. The system 100 includes an additive manufacturing apparatus 102 (e.g., a 3D printer) comprising a print-head assembly 104. The print-head assembly 104 comprises a movable armature 106 coupled to an extrusion nozzle 108, wherein the extrusion nozzle 108 extends from the armature 106 towards a build plate (printing surface) 110 of the system 100. The build plate 110 comprises a printing surface upon which a printing material 112 is deposited. In an example, the build plate 110 can be at least partially formed of a conductive material, such as copper, although other conductive materials are contemplated. In another example, the build plate 110 can be at least partially formed of a semiconductor, such as silicon.

The extrusion nozzle 108 can be formed of a conductive material, such as aluminum, copper, etc. The extrusion nozzle 108 has an arc suppressor 118 attached thereto and/or integrated therewith. The arc suppressor 118 is formed of a semiconductor, such as silicon. In an example, the arc suppressor 118 has a ring-like shape with an opening, such that the printing material 112 flows through the opening of the arc suppressor 118. For instance, the opening of the arc suppressor 118 can have a diameter of between 0.3 mm and 0.8 mm. In a more specific example, the opening of the arc suppressor 118 can have a diameter between 0.45 mm and 0.55 mm. As indicated previously, the arc suppressor 118 can be integrated with the extrusion nozzle 108, such that the extrusion nozzle 108 and the arc suppressor 118 can be perceived as one piece (and are manufactured together). In another example, a legacy additive manufacturing system can be retrofitted with the arc suppressor 118, wherein the arc suppressor 118 is coupled to the extrusion nozzle 108 by way of a thermocouple adhesive. Functionality of the arc suppressor 118 will be set forth in greater detail below.

The printing material 112 is extruded via a channel (not shown) in the extrusion nozzle 108 onto the build plate 110, wherein the printing material 112 passes through the opening of the arc suppressor 118. The diameter of the opening of the arc suppressor 118 is greater than the diameter of the exit opening of the channel in the extrusion nozzle 108, such that the printing material 112 does not contact the arc suppressor 118 or minimally contacts the arc suppressor 118 when exiting the extrusion nozzle 108. Further, the material of the arc suppressor is non-adhesive with respect to the printing material 112, such that even if the printing material 112 contacts the arc suppressor 118, the printing material 112 fails to adhere to the arc suppressor 118.

The system 100 further comprises an (electrical) energy source 114 that is electrically coupled to the extrusion nozzle 108 and the build plate 110, wherein the energy source 114 is controlled to apply a bias voltage to the extrusion nozzle 108. For instance, the energy source 114 can be controlled to apply a bias voltage of between 750 V and 1500 V to the extrusion nozzle 108, while the build plate 110 is grounded. This creates an electric field throughout a biasing region 116 between the extrusion nozzle 108 and the build plate 110, which in turn acts to bias the printing material 112 as the printing material passes through the biasing region 116. In an exemplary embodiment, the electric field can be between 3.0 and 4.0 MV/m, although desired magnitude of the electric field may depend upon the type of the printing material 112.

If the arc suppressor 118 were not present on the additive manufacturing apparatus 102, the electric field, when large enough, may cause excess charge to be built up on the extrusion nozzle 108. This excess charge, when unmitigated, can lead to an arc flash from the extrusion nozzle 108 to the build plate 110, potentially burning the printing material 112 as well as possibly damaging the additive manufacturing apparatus 102. The arc suppressor 118, formed of a semiconductor, causes the excess charge to slowly "bleed-off". Hence, coupling of the arc suppressor 118 to the extrusion nozzle 108, such that the arc suppressor 118 is positioned between the extrusion nozzle 108 and the build plate 110, mitigates excess charge building up on the extrusion nozzle 108, thereby mitigating the possibility of arcing and damage to the printing material 112.

In another exemplary embodiment, a magnetic field can be induced in the biasing region 116 (in addition to or as an alternative to the electric field). In such an embodiment, the energy source 114 can include permanent magnets and/or electromagnets. Further, the extrusion nozzle 108 and/or the build plate 110 can comprise permanent magnets and/or electromagnets such that a magnetic field is generated throughout the biasing region 116. For example, a ring of magnets can be positioned around the extrusion nozzle 108 and/or magnets can be coupled to the underside of the build plate 110. Other embodiments are also contemplated.

Exemplary operation of the system 100 is now set forth. Initially, the printing material 112, which can be or include PVDF, is doped with a dopant which can be or include Aluminum Nitride, PZT, or other suitable exotic material, wherein the doping is undertaken to reduce the magnitude of an electric field needed to induce piezoelectric properties in the printing material 112. Dopant levels may vary from 1 to 50% by weight of the total mass. The additive manufacturing apparatus 102 is brought up to operating temperature, which may higher than 100 degrees Celsius (e.g., between 100 and 200 degrees Celsius). The additive manufacturing apparatus 102, once brought up to operating temperature, is provided with the printing material 112, and the printing material 112 is directed through the extrusion nozzle 108 as the movable armature 106 positions the extrusion nozzle 108 at desired positions relative to the build plate 110 (accordingly, the feed stock (the printing material 112) exits through the channel of the extrusion nozzle 108 and also through the opening of the arc suppressor 118). The additive manufacturing apparatus 102 (including the movable armature 106 and the print head assembly 104) is controlled based upon a control algorithm executed by a processor (not shown). In this example, the energy source 114 is controlled to create an electric field through the biasing region 116, wherein the electric field causes alpha and beta phase orientation in the printing material 112 to occur, thereby causing the printing material 112 to have piezoelectric properties. The arc suppressor 118 acts to "bleed off" excess charge that accumulates at the print-head assembly 104 (e.g., on the extrusion nozzle 108), thereby preventing arcing from occurring between the print-head assembly 104 and the build plate 110.

Figure 2:
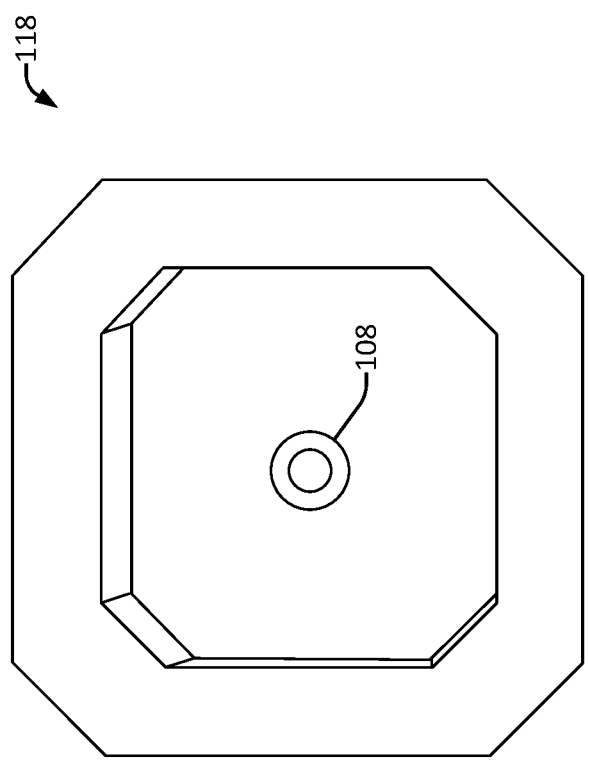
FIG. 2 is an isometric view of an exemplary arc suppressor.

Referring now to FIG. 2, an exemplary isometric view of the arc suppressor 118 is depicted. The arc suppressor 118, for example, can be additively manufactured. The arc suppressor 118 as shown is shaped as an octagonal ring; however, the arc suppressor 118 can have a square profile, a hexagonal profile, a circular profile, an ovular profile, etc. For instance, the arc suppressor 118 can be formed of silicon, and have a thickness of about 1500 µm. The interior diameter of the octagonal ring is about 5 mm, and an exterior diameter of the octagonal ring is between about 7 mm and 8 mm. As shown, a tip of the extrusion nozzle 108, where the printing material 112 exits the extrusion nozzle 108, is positioned at a center axis of the arc suppressor 118, such that the printing material 112 passes through the opening of the arc suppressor 118 but contact between the printing material 112 and sidewalls of the arc suppressor 118 is mitigated.

Figure 3:
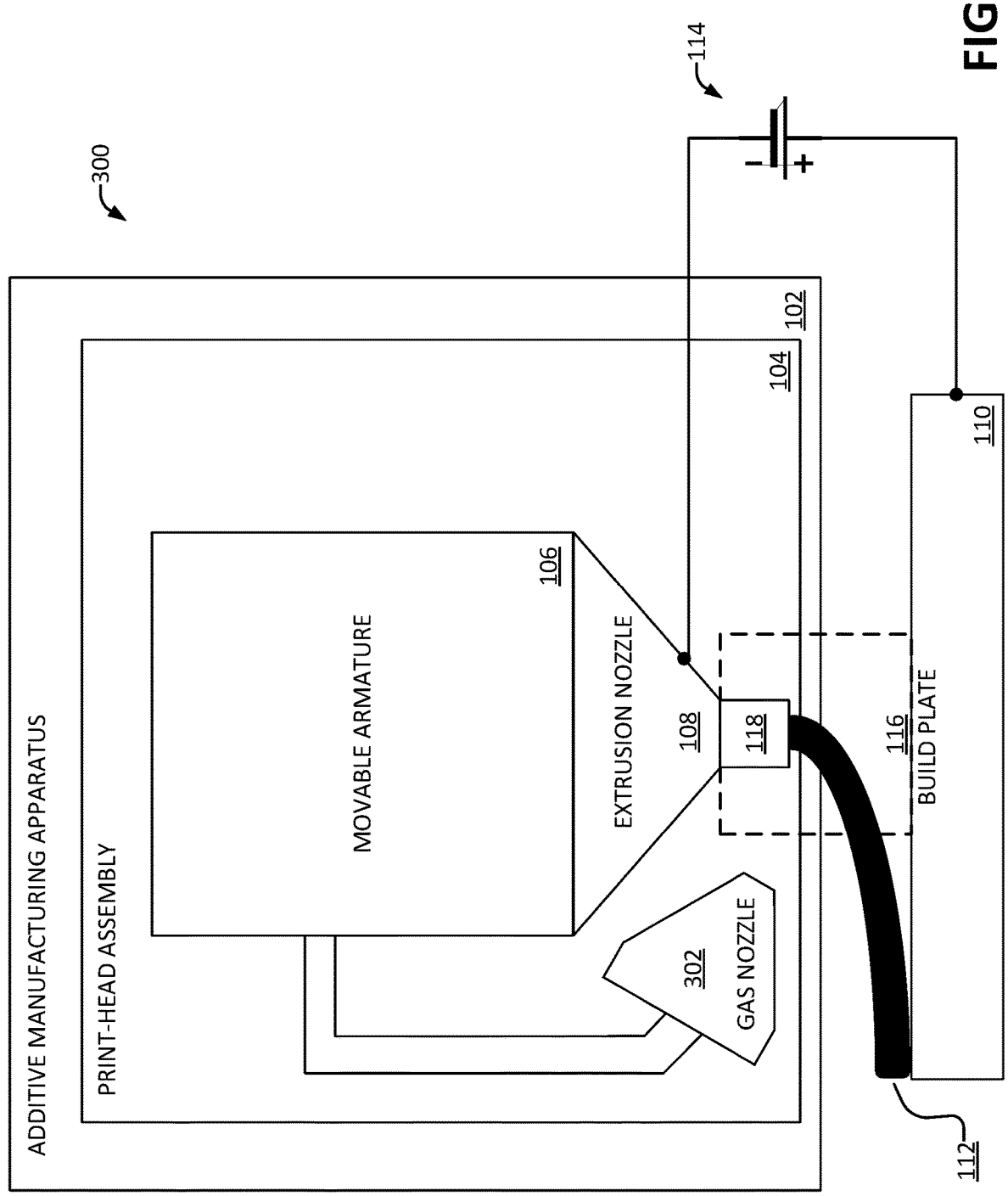
FIG. 3 is a schematic of another exemplary additive manufacturing system.

With reference now to FIG. 3, another exemplary system 300 that facilitates additive manufacturing of exotic materials is depicted. The system 300 comprises an additive manufacturing apparatus 302, wherein the additive manufacturing apparatus 302 includes the print-head assembly 104 (including the movable armature 106 and the extrusion nozzle 108). The system 300 additionally includes the build plate 110 and the energy source 114. The system 300 additionally comprises a gas nozzle 302, wherein the gas nozzle 302 is configured to emit a gas such that the biasing region 116 comprises the gas emitted from the gas nozzle 302. The gas nozzle 302 is depicted as being coupled to the movable armature 106; in other embodiments, the gas nozzle 302 may be coupled to the build plate 110. In an example, the gas emitted from the gas nozzle 302 can be an inert gas (e.g., Argon, Nitrogen, SF6, etc.) or a reactive gas (e.g., NO, $SF_4$, $SO_2$, $H_2N_2$, $SO_2$, $CH_2H_2$, etc.). An inert gas in the biasing region 116 can alter breakdown characteristics in the biasing region 116, thereby further suppressing arcs that may occur between the extrusion nozzle 108 and the build plate 110 when an electric or magnetic field is formed in the biasing region 116. Moreover, while the system 300 depicts the additive manufacturing apparatus 102 comprising the arc suppressor 118, it is to be understood that the arc suppressor 118 is optional when gas emitted by way of the gas nozzle 302 is sufficient to suppress arcs between the extrusion nozzle 108 and the build plate 110.

In an example, a gas to emit from the gas nozzle 202 can be selected based upon analysis of a Paschen Curve, where data indicates at which voltages different gases break down. Reactive gases can also be used along with an additively manufactured base polymer film to intentionally swell or generate reactive sites for chemical layers to be built upon the base polymer film. For instance, using nanoparticle silicon in a polymer film, a reactive gas reduces and oxidizes the surface to benefit a supporting chemical site, for instance, diazonium salts, for fluorescent compound surfaces.

It is to be understood that even though the gas nozzle 302 shown in FIG. 3 is depicted as being conically shaped, other shapes are also contemplated. The gas nozzle 302 can be of a variety of shapes that are well-suited for expelling gas such that the biasing region 116 includes gas emitted from the gas nozzle 302. For instance, an opening of the gas nozzle 302 can be a rectangular shape, a circular shape, etc. Further, while the system 300 illustrates that the additive manufacturing apparatus 102 includes a single gas nozzle, it is to be understood that the additive manufacturing apparatus 102 can include several gas nozzles (e.g., arranged symmetrically about the biasing region 116). In another exemplary embodiment, gas that is configured to mitigate arcing can be introduced into the biasing region 116 by means other than that of the gas nozzle 302. Further, while not illustrated, the additive manufacturing apparatus 102 and the build plate 110 may be placed in a container that is configured to prevent evacuation of the gas from the biasing region 116.

Figure 4:
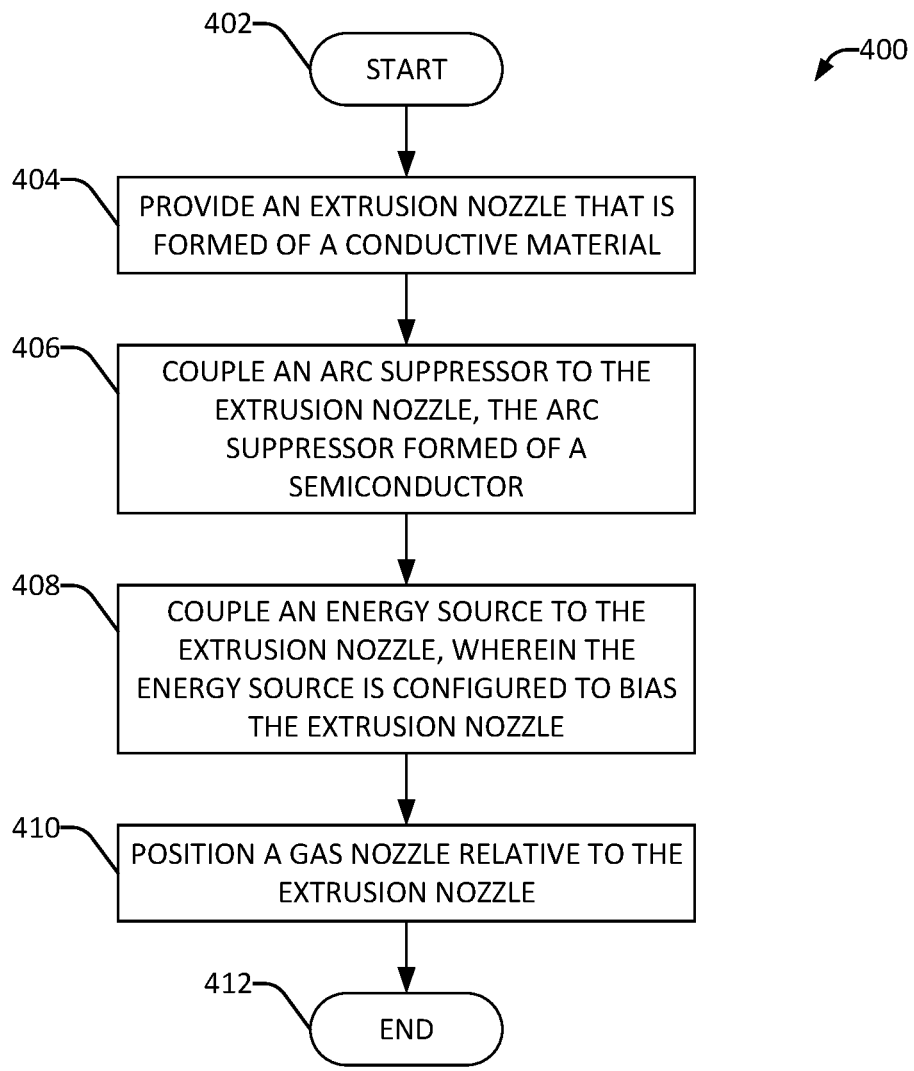
FIG. 4 is a flow diagram that illustrates an exemplary methodology for constructing an additive manufacturing apparatus that is well-suited to form piezoelectric sensors.
Figure 5:
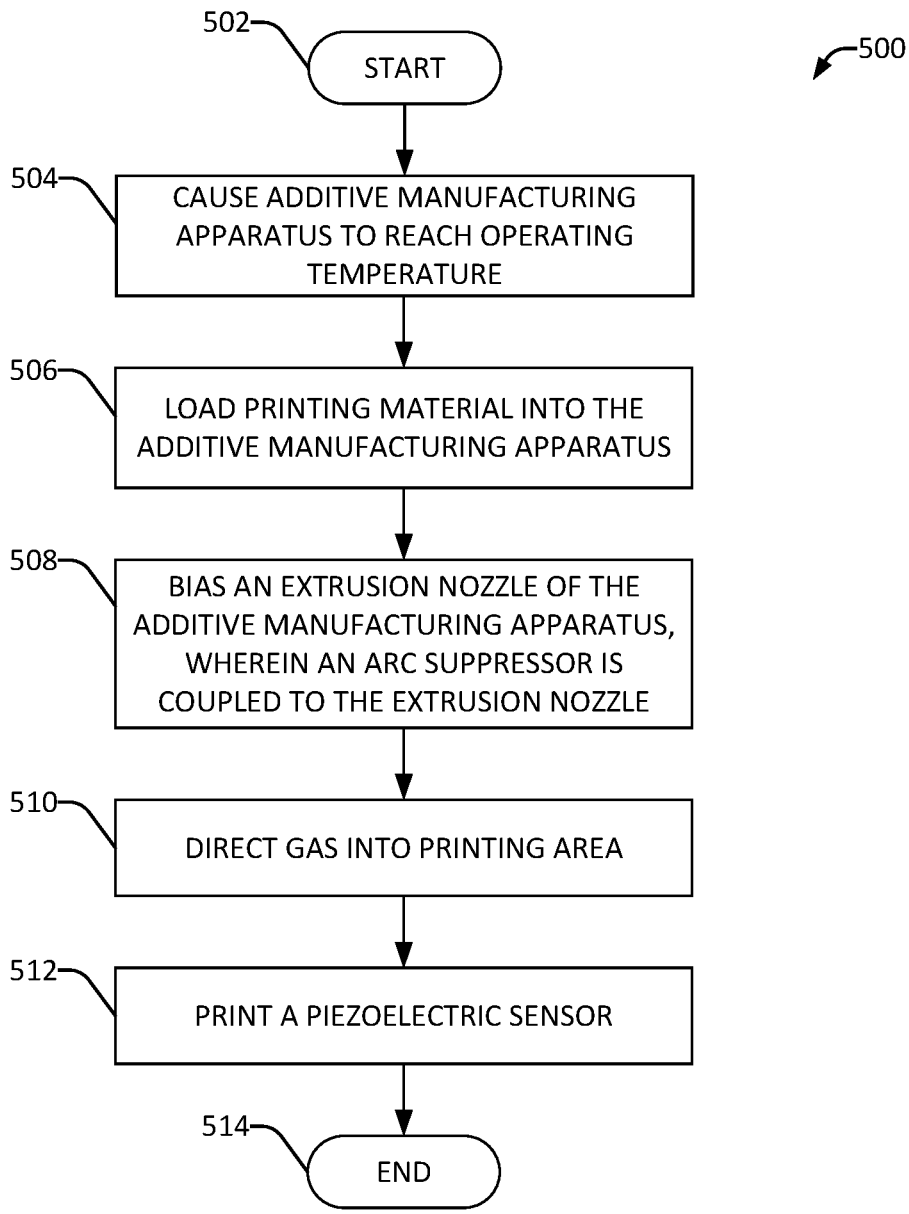
FIG. 5 is a flow diagram that illustrates an exemplary methodology for additively manufacturing a piezoelectric sensor.

FIGS. 4 and 5 illustrate exemplary methodologies relating to additive manufacture of piezo-electric sensors. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Referring now solely to FIG. 4, an exemplary methodology 400 that facilitates forming an additive manufacturing apparatus that is well-suited to additively manufacture piezo-electric sensors is illustrated. The methodology 400 starts at 402, and at 404, an extrusion nozzle formed of a conductive material (e.g., aluminum) is provided. The extrusion nozzle has a channel by way of which printing material is extruded, wherein the extrusion nozzle is positioned above a build plate (also formed of a conductive material) upon which the printing material is to be printed.

At 406, an arc suppressor is coupled to the extrusion nozzle, wherein the arc suppressor is formed of a semiconductor. The arc suppressor has a ring-like shape, and the arc suppressor is coupled to the extrusion nozzle such that the channel of the extrusion nozzle is aligned with a central axis of the arc suppressor (e.g., such that printing material exiting the extrusion nozzle passes through the arc suppressor). In an example, the arc suppressor can be coupled to the extrusion nozzle by way of a thermocouple adhesive. In another example, the arc suppressor can be integrated with the extrusion nozzle such that the extrusion nozzle and arc suppressor appear as a monolithic piece.

At 408, an energy source is coupled to the extrusion nozzle, wherein the energy source is configured to bias the extrusion nozzle with a relatively high voltage (e.g., between about 750 V and 1500 V). Biasing of the extrusion nozzle relative to the build plate results in formation of an electric field in a biasing region between the extrusion nozzle and the build plate, wherein the printing material (once the printing material exits the extrusion nozzle) passes through the biasing region. This, in turn, induces piezoelectric properties into the printing material as it is being printed, thereby allowing for piezoelectric sensors to be constructed. At 410, a gas nozzle is positioned relative to the extrusion nozzle such that arc suppressing gas is placed in the biasing region. The arc suppressor and the arc suppressing gas act in conjunction to mitigate arcs that would otherwise form between the extrusion nozzle and the build plate. The methodology 400 completes at 412.

Turning now to FIG. 5, an exemplary methodology 500 for printing a piezoelectric sensor is illustrated. The methodology 500 starts at 502, and at 504 an additive manufacturing apparatus (e.g., 3D printer) is caused to reach an operating temperature (e.g., which may be several hundred degrees Celsius.

At 506, printing material is loaded into the additive manufacturing apparatus, wherein the printing material can be or include PVDF (optionally doped with a dopant such as Aluminum Nitride, PZT, etc.). PVDF, is doped with a dopant which can be or include Aluminum Nitride, PZT, or other suitable exotic material Optionally, at 508, an extrusion nozzle of the additive manufacturing apparatus is biased with a bias voltage, wherein the bias voltage can be in a range between 750 V and 1500 V. Thus, an electric field is formed in a printing area (where printing material is to be deposited). Further, as described above, an arc suppressor is coupled to the extrusion nozzle, wherein the arc suppressor is formed of a semiconductor.

Optionally, at 510, an arc suppressing gas is introduced into the printing area. In an example, the arc suppressing gas may be Argon, although other gases are contemplated.

At 512, the additive manufacturing apparatus is controlled to generate a piezoelectric sensor. As noted above, when the printing material passes through the electric field, piezoelectric properties are introduced into the printing material. The methodology 500 completes at 514.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An additive manufacturing apparatus comprising:
    an extrusion nozzle of the additive manufacturing apparatus, wherein the extrusion nozzle is formed of a conductive material, wherein the extrusion nozzle comprises a channel by way of which printing material exits the extrusion nozzle;
    an arc suppressor that is coupled to the extrusion nozzle, wherein the arc suppressor has a ring-like shape with an opening, and further wherein the printing material passes through the opening of the arc suppressor responsive to the printing material exiting the extrusion nozzle; and
    an energy source that is configured to apply a bias voltage to the extrusion nozzle, wherein an electric field is formed in a biasing region between the extrusion nozzle and a build plate upon which the printing material is deposited, and further wherein piezoelectric properties are induced in the printing material as the printing material passes through the biasing region.

2. The additive manufacturing apparatus of claim 1, wherein the extrusion nozzle is formed of aluminum.

3. The additive manufacturing apparatus of claim 1, wherein the arc suppressor is formed of a semiconductor and wherein the semiconductor is silicon.

4. The additive manufacturing apparatus of claim 1, wherein the arc suppressor is coupled to the extrusion nozzle by way of a thermocouple adhesive.

5. The additive manufacturing apparatus of claim 1, wherein the bias voltage is between 750 V and 1500 V.

6. The additive manufacturing apparatus of claim 1, wherein the opening has a diameter of 5 mm.

7. The additive manufacturing apparatus of claim 1, further comprising a gas nozzle that is configured to cause the biasing region to comprise a gas.

8. The additive manufacturing apparatus of claim 7, wherein the gas is one of Argon, Nitrogen, or Helium.

9. The additive manufacturing apparatus of claim 7, further comprising a container that is configured to prevent evacuation of the gas from the biasing region.

10. The additive manufacturing apparatus of claim 1, wherein the printing material is polyvinylidene fluoride.

11. A method for forming an additive manufacturing apparatus that is configured to create a piezoelectric sensor, the method comprising:
    providing an extrusion nozzle, wherein the extrusion nozzle is formed of a conductive material, and further wherein the extrusion nozzle has a channel by way of which printing material exits the extrusion nozzle;

coupling an arc suppressor to the extrusion nozzle, wherein the arc suppressor is formed of a semiconductor and has a ring-like shape with an opening, wherein the arc suppressor is positioned relative to the extrusion nozzle such that printing material that exits the extrusion nozzle passes through the opening of the arc suppressor;

coupling an energy source to the extrusion nozzle, wherein the energy source is configured to apply a bias voltage to the extrusion nozzle thereby forming an electric field in a biasing region between the extrusion nozzle and a build plate upon which the printing material is to be deposited, and further wherein piezoelectric properties are induced in the printing material when the printing material passes through the biasing region; and positioning a gas nozzle relative to the extrusion nozzle such that the biasing region includes gas emitted by the gas nozzle, wherein the arc suppressor and the gas are configured to mitigate arcing between the extrusion nozzle and the build plate.

12. The method of claim 11, wherein the bias voltage is between 750 V and 1500 V.

13. The method of claim 11, wherein the semiconductor is silicon.

* * * * *